United States Patent
Doris et al.

(10) Patent No.: US 8,318,568 B2
(45) Date of Patent: Nov. 27, 2012

(54) TUNNEL FIELD EFFECT TRANSISTOR

(75) Inventors: Bruce B. Doris, Brewster, NY (US);
Kangguo Cheng, Guilderland, NY (US);
Wilfried E. Haensch, Somers, NY (US);
Ali Khakifirooz, Slingerlands, NY (US);
Isaac Lauer, White Plains, NY (US);
Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 12/760,287

(22) Filed: Apr. 14, 2010

(65) Prior Publication Data
US 2011/0254080 A1    Oct. 20, 2011

(51) Int. Cl.
*H01L 21/336* (2006.01)
(52) U.S. Cl. .................. 438/300; 438/301; 257/E21.4
(58) Field of Classification Search .......... 438/300, 438/301; 257/E21.4
See application file for complete search history.

(56) References Cited

U.S. PATENT DOCUMENTS

| | | | | |
|---|---|---|---|---|
| 5,672,530 | A * | 9/1997 | Hsu | 438/296 |
| 7,354,839 | B2 * | 4/2008 | Wei et al. | 438/305 |
| 7,465,976 | B2 * | 12/2008 | Kavalieros et al. | 257/213 |
| 2007/0178650 | A1 * | 8/2007 | Chen et al. | 438/301 |
| 2009/0101975 | A1 * | 4/2009 | Holz et al. | 257/347 |
| 2011/0084319 | A1 * | 4/2011 | Zhu et al. | 257/288 |

OTHER PUBLICATIONS

"Performance Enhancement of Vertical Tunnel Field-Effect Transistor with SiGe in the delp+ Layer", K. K. Bhuwalka, et al. Jap. J. Appl. Phys., vol. 43, p. 4073 (2004).
"Performance Enhancement of the Tunnel Field Effect Transistor using a SiGe Source", N. B. Patel et al., Int. Workshop Phys. Semicon. Dev., p. 1, (2007).
"Impact of SOI, $Si_{1-x}Ge_xOI$ and GeOI substrates on CMOS compatible Tunnel FET performance", F. Mayer, et al., IEDM Tech. Dig. (2008) pp. 163-166.
"Germanium-Source Tunnel Field Effect Transistors with Record High $I_{ON}/I_{OFF}$", S. Kim, et al., Symp. VLSI Tech. (2009) pp. 178-179.

* cited by examiner

*Primary Examiner* — Wensing Kuo
(74) *Attorney, Agent, or Firm* — George Sai-Halasz; Louis J. Percello

(57) ABSTRACT

A method for fabricating an FET device characterized as being a tunnel FET (TFET) device is disclosed. The method includes processing a gate-stack, and processing the adjoining source and drain junctions, which are of a first conductivity type. A hardmask is formed covering the gate-stack and the junctions. A tilted angle ion implantation is performed which is received by a first portion of the hardmask, and it is not received by a second portion of the hardmask due to the shadowing of the gate-stack. The implanted portion of the hardmask is removed and one of the junctions is exposed. The junction is etched away, and a new junction, typically in-situ doped to a second conductivity type, is epitaxially grown into its place. A device characterized as being an asymmetrical TFET is also disclosed. The source and drain junctions of the TFET are of different conductivity types, and the TFET also includes spacer formations in a manner that the spacer formation on one side of the gate-stack is thinner than on the other side of the gate-stack.

8 Claims, 5 Drawing Sheets

TUNNEL FIELD EFFECT TRANSISTOR

BACKGROUND

The present invention relates to electronic devices and integrated circuits. In particular, it relates to tunnel FET devices and low power integrated circuits fabricated with such devices.

As FET (Field-Effect-Transistor) devices are being scaled down, the technology becomes more complex, and changes in device structures and new fabrication methods are needed to maintain the expected performance improvements from one successive device generation to the next. For many applications it is also of interest to keep power consumption of integrated circuits below certain limits. Hence variations on the standard FET devices and CMOS circuits are being contemplated. One such alternative FET type device with potential for low power consumption is the tunnel FET (TFET) device.

BRIEF SUMMARY

A method for fabricating an FET device characterized as being a tunnel FET (TFET) is disclosed. The method includes fabricating a gate-stack, and processing adjoining first and second junctions of a first conductivity type. A hardmask is then formed which covers the gate-stack and the junctions. A tilted angle ion implantation is received by a first portion of the hardmask, and it is not received by a second portion of the hardmask due to the shadowing of the gate-stack. One of the portions of the hardmask is removed and the first junction exposed. The first junction is etched away and a new junction, in-situ doped to a second conductivity type, is epitaxially grown into its place.

An FET device characterized as being an asymmetrical TFET is also disclosed. The TFET includes a gate-stack, a channel region underneath the gate-stack, a first and a second junction adjoining the gate-stack and being capable for electrical continuity with the channel. The first junction and the second junction are of different conductivity types. The TFET also includes spacer formations in a manner that the spacer formation on one side of the gate-stack is thinner than on the other side.

BRIEF DESCRIPTION OF THE SEVERAL VIEWS OF THE DRAWINGS

These and other features of embodiments of the invention will become apparent from the accompanying detailed description and drawings, wherein.

DETAILED DESCRIPTION

Figure 1:
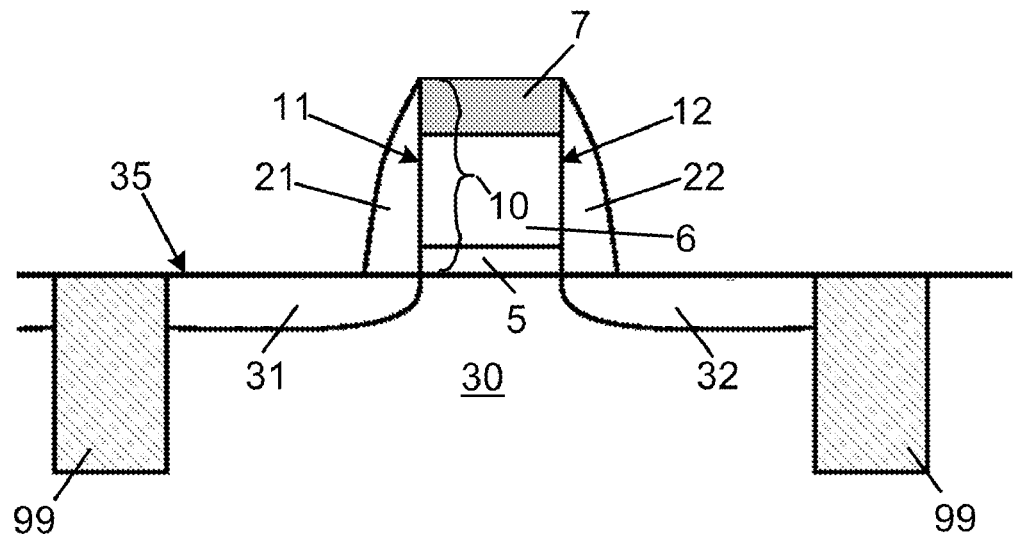
FIG. 1 shows a state in an FET fabrication which is a suitable starting point for embodiments of the present disclosure.

It is understood that FET (Field Effect Transistor) devices, often also referred as MOS devices, are well known in the electronic arts. Standard components of an FET are the source, the drain, the body in-between the source and the drain, and the gate. The gate is overlaying the body and is capable of inducing a conducting channel on the surface of the body between the source and the drain. In the usual nomenclature, the body is adapted to host the channel, and the region underneath the gate is called the channel region. The gate is typically separated from the body by the gate insulator, or gate dielectric.

Microelectronics progress has been synonymous with decreasing feature sizes. Decreased feature sizes allow for ever higher circuit counts, and increased circuit densities for integrated circuits (IC). However, along with the advantages of miniaturization there are also problems arising due to the smaller dimensions. A notable such difficulty is that shorter gate-lengths ultimately entail difficulty in turning devices off. An ideal FET device in silicon (Si) has an approximately 60 mV/decade subthreshold current roll off. Namely, the device current decreases by a factor of ten with every 60 mV decrease of the gate voltage below the threshold. However, with gates in the 100 nm and below lengths, roll off slopes deteriorate. A less steep slope, reaching 100 mV/decade and worse, coupled with the lower threshold voltages associated with smaller devices, leads to a problematic inability to turn off the transistors. The current running through the FET device in the off, or subthreshold, mode may cause problems with the power consumption of ICs. There are many applications for ICs where low power consumption is an important consideration.

In the last few years so called tunnel FET (TFET) devices have been proposed for low power integrated circuits. Briefly, in the tunnel FET, in contrast to the standard FET, the source and drain junctions are of different conductivity type, namely if one is n-type then the other is p-type. The mechanism of conduction for the TFET differs from that of the standard one, in that the carriers tunnel through the semiconductor gap in order to enter the inversion layer of the channel region. Such tunneling has been known in the art, and typically it is referred to as band-to-band tunneling. The attractiveness of TFETs may lie in the fact that the ratio of the on-state to off-state current is high, and the subthreshold slope may be even steeper than that of the classical FETs, possibly below 40 mV/decade. This means that the TFET may be turned off to a degree that subthreshold power consumption becomes manageable. Hence TFET based integrated circuits may be good candidates for low power CMOS circuit applications.

When one contemplates processing a TFET, the main difference compared to a standard FET may be in the differing conductivity type of the source and drain junctions. In standard FET devices, of course, the source and drain are of same conductivity type, either both n-type for NFETs, or both p-type for PFETs. A known process in the art for fabricating standard same type of junctions for FETs is the self aligned ion implantation. A gate, or gate-stack, is fabricated and this is followed by an implantation in a direction perpendicular to the surface. The shadowing effect of the gate-stack assures that the source and drain are precisely aligned to gate without the need for lithographic masking. In the art such a process, which uses no lithography, but it still results in aligned structures, is referred to as self aligned.

If there is a need for junctions of differing conductivity type, the self aligned implantation cannot be used because that creates, depending on the implant species, either two n-type or two p-type junctions. The straightforward answer in the art to deal with this problem has been the use of lithographic masking. However, this approach has drawbacks, and it may not be extendable to ever smaller device dimensions.

Apart of the complexity that accompanies an additional lithographic masking step, such a masking may have problems in principle. It is generally the case that for performance purposes the gate-length is the minimal feature size in IC fabrication. At a given state of technology progression in art there is a characteristic minimum mask alignment tolerance. This minimum tolerance depends a many factors, but primarily it is connected with the wavelength of the light in lithographic tools. When it comes to fabricating the gate, lithography is usually pushed to its limits, and at times the gate-length is further decreased using various non-lithographic techniques. This means that in standard FETs one may have the possibility of selecting a gate-length to be less than the minimum mask alignment tolerance.

For a TFET, as its fabrication is practiced in the art, in order to separately deal with source and drain junctions due to their different conductivity type, for masking one or the other junction, a mask edge may have to be located over the gate. An ability to reliably locate a mask edge over the gate implies a better, namely smaller, minimum mask alignment tolerance than the gate-length. Unfortunately, this would imply that the gate is not fabricated to be as short as possible, hence giving away potential circuit performance. There is a need for a masking procedure which does not rely on lithography for a precision alignment on the scale of the gate-length. Embodiments of the present invention teach such a self aligned masking for fabricating TFET devices, which fabrication may yield TFET devices scalable to ever smaller dimensions, and may also allow further refinements, such as asymmetric device structures.

Typically, the semiconductor material of an FET, or of a TFET, is the mainstay material of microelectronics, namely silicon (Si). However, embodiments of present disclosure include additional materials of importance in the microelectronics arts, such as SiGe alloy mixtures, possibly germanium (Ge), and compound semiconductors such as gallium arsenide (GaAs).

Manufacturing of FETs is very well established in the art. It is understood that there are a large number of steps involved in such processing, and each step might have practically endless variations known to those skilled in the art. It is further understood only those process steps will be detailed here that are of interest for embodiments of the present invention.

FIG. 1 shows a state in an FET fabrication which is suitable as starting point for embodiments of the present disclosure. The figure shows a substrate 30 having a principal surface 35. The substrate 30 may be any type known in the electronic art, such as bulk Si, or semiconductor on insulator (SOI), fully depleted, or partially depleted, or any other kind without limitation. FIG. 1 illustrates only one device, which typically may only be a small fraction of a whole circuit structure, such as for instance, an integrated circuit on an electronic chip. Often, but not exclusively, the devices are separated by isolation structures 99. The figure shows a shallow trench 99 isolation scheme, as this is a typical advanced isolation technique available in the art.

Up to the point illustrated in FIG. 1, the processing of a TFET may proceed along known paths of standard FET and/or CMOS fabrication. As shown, a gate-stack 10 has already been fabricated. The gate-stack may contain a variety of differing layers. Any and all gate-stack compositions are allowed within the embodiments of the present invention. The figure illustrates an embodiment where the gate-stack may contain three layers, a gate insulator or dielectric layer 5, a conductive layer 6, and a protective layer 7 which may be of nitride.

Depending on the nature of the conductive layer 6, one may characterized the device as a metal gate device, or a polysilicon gate device. Although many gate-stacks known in the art contain both polysilicon and metal, the determining factor which characterizes the device is the nature of the layer 6 which is in direct contact with the gate insulator 5. When this layer, in the figure indicated with number 6, is metallic, such as for instance, W, Mo, Mn, Ta, TiN, TaN, TaC, TaAlN, TiAlN, WN, Ru, Cr, Ta, Nb, V, Mn, Re and others, the device is may be characterized as a metal gate device. When the layer 6 which is in direct contact with the gate insulator 5 is polysilicon, one may characterize the device as a polysilicon gate device. The gate insulator layer 5 may be an oxide based dielectric, or it may be a so called high-k dielectric layer. All such gate-stack variations may be part of various embodiments of the invention. In subsequent figures the various layers of the gate-stack will not be indicated individually, since it is understood that all possible compositions are allowed.

The gate-stack has two sides a first side 11 and a second side 12. Two junctions have been processed, a first junction 31 adjoining the first side 11 and a second junction 32 adjoining the second side. These junctions are those of a standard FET source and drain. At this stage of the fabrication both junctions are of the same conductivity type which may be referred to as a first conductivity type. They may be both either n-type, or p-type. Their fabrication may have proceeded by methods known in the art, typically by implantation of dopant species and subsequent annealing.

FIG. 1 also illustrates that respective spacers have been fabricated, one 21 over the first side 11 of the gate-stack 10, and one 22 over the second side 12 of the gate-stack 10. Such spacers are well known in the art. The figure shows them in direct contact with their respective sides, but this may, or may not be so. As discussed already, all figures are for illustrative purposes only, and no limitations regarding details of methods, or structures, should be read into them.

As it is also illustrated in FIG. 1, the principal surface 35 is associated with the plane of the junctions, the channel, the device body. The principal surface defines a plane that serves as the base orientation relative for other directions and features to be discussed in the followings. Thus, for instance, the height of the gate-stack 10 is measured in a direction which is substantially perpendicular to the principal surface 35.

Figure 2:
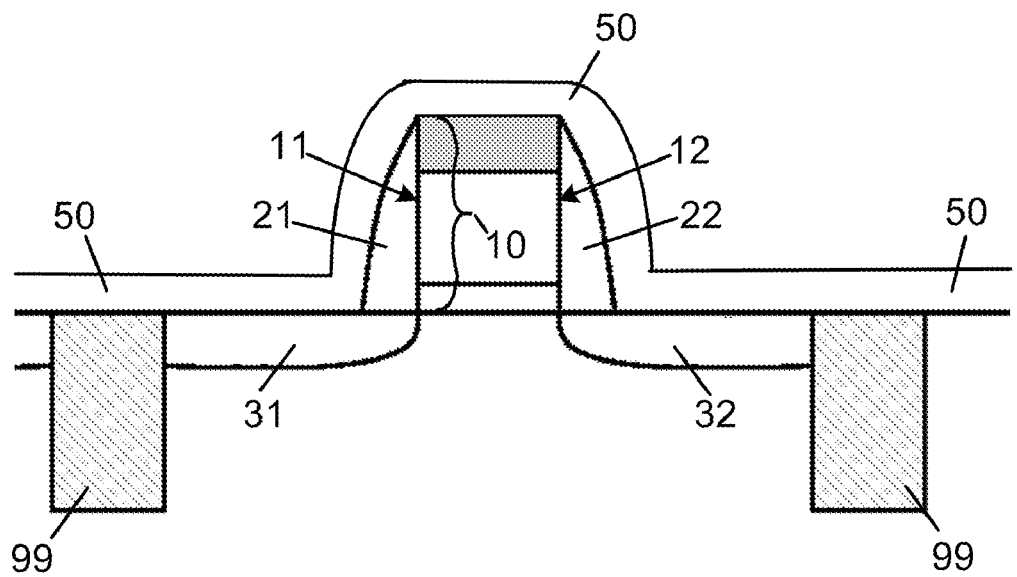
FIG. 2 shows a hardmask formed over the device.

FIG. 2 shows a hardmask 50 formed over the device. Embodiments of the invention may aim at differentiating between the two junctions by being able to separately processing each of them. The state of fabrication shown in FIG. 2 is a step in the service of such a goal. The hardmask 50 has been deposited over the whole of the device, which includes the gate-stack 10 and first and second junctions 31, 32, without the use of masking. Such a so called blanket deposition of a hardmask is known to one skilled in the art, and often used for a variety of purposes. The hardmask material may be nitride, oxide, oxynitride, high-k materials, or any suitable combination of those materials, and typically it is disposed over the surface essentially in a conformal manner.

Figure 3:
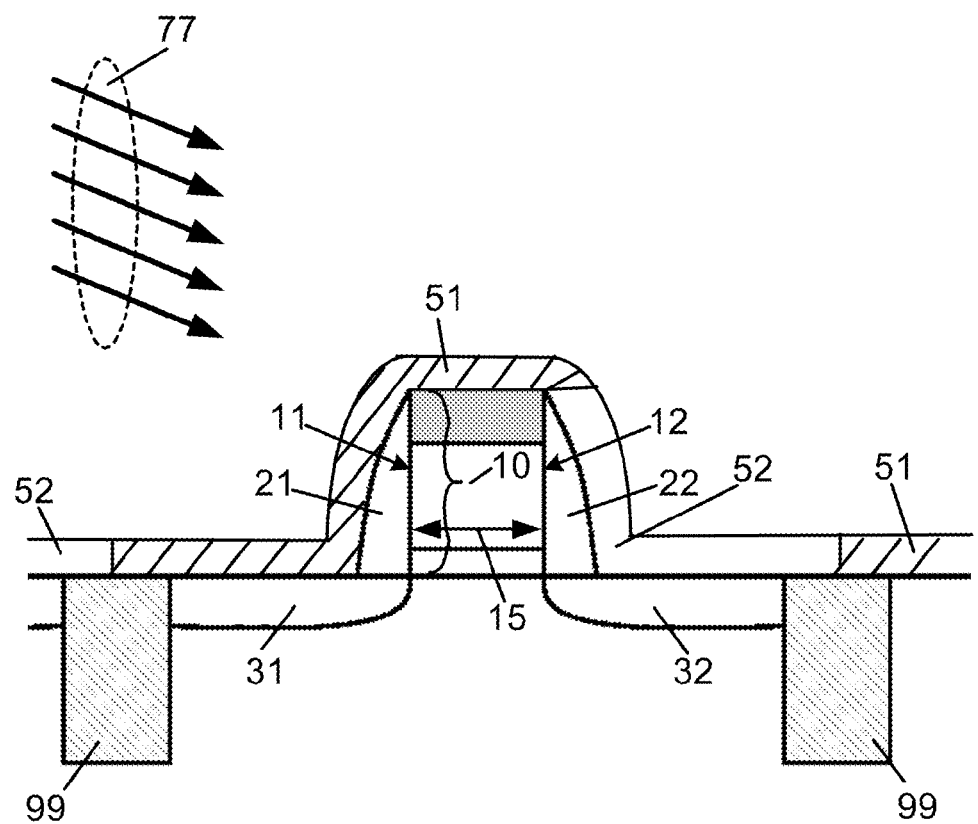
FIG. 3 shows tilted implantation of the hardmask.

FIG. 3 shows a tilted implantation of the hardmask. The aim of performing this implantation is to create damage in the hardmask. Consequently, the implanted species is selected on such basis. Xenon (Xe), argon (Ar), germanium (Ge), fluorine (F), may be suitable species for such an implantation. It is known in the art that the etch properties of a damaged hardmask, such as nitride, change due to the damage. Hence if needed, one may remove by etching a damaged portion of a hardmask and leave undamaged portions essentially intact. Alternatively, the tilted implantation is to modify the hardmask to improve its etch resistance to the subsequent etch. Consequently, the implanted species is selected on such basis. Germanium (Ge), silicon (Si), nitrogen (N), carbon (C), may be a suitable species for such an implantation. It is known in the art that the etch properties of a modified hardmask, such as nitride, change due to the incorporation of other species. Hence if needed, one may remove by etching the un-implanted portion of a hardmask and leave implanted portions essentially intact.

The implantation 77 is performed at a tilted angle. The customary direction of implantation during device processing is vertical relative to the principal surface 35 of the device. In embodiments of the present invention, as illustrated in FIG. 3, the implantation 77 is not vertical, but occurs at an angle tilted from vertical, exposing the direction of first side 11 of the gate-stack 10 to ion damage.

Due to the shadowing of the gate-stack 10, the tilted angle implantation defines two portions in the hardmask: a first portion 51 of the hardmask which receives the implant, and becomes damaged, and a second portion 52 of the hardmask which is not receiving the implant, and it is not suffering damage. Tilting of the implant angle from the vertical can be selected in such manner that the first portion 51 of the hardmask, the one that receives the ions, covers the first side 11 of the gate-stack, including a covering spacer 21 if any, and the adjoining the first junction 31; the second portion 52 of the hardmask, the one that is shadowed from the ions, covers the second side 12 of the gate-stack, including a covering spacer 22 if any, and the adjoining the second junction 32. Usually, but necessarily, a plane which contains the vertical direction and the direction of the ion implantation would be perpendicular to the width direction of the gate-stack 10. The exact value of the tilt angle depends on the details of the geometry of the device, such as the ratio of the gate-length 15 to the height of the gate-stack, the extent of the junctions, mainly that of the second junction 32, and the proximity of devices to each other, as well. Although the figures fully illustrate only a single device, clearly neighboring gate-stacks may shadow the implant as well. Depending on the height of the gate-stack and the space between two neighboring gate-stacks, in many embodiments of the invention the tilting of the implant angle from vertical my be between about 5° to 85°, with a more typical range being between 20° and 60°.

The hardmask thickness may be between 3 nm and 30 nm, with a more typical range being 5 nm to 10 nm. With implant species such as Xe, Ar, helium (He), carbon (C), nitrogen (N), Si, Ge, fluorine (F), or their combinations, depending on hardmask thickness and material the implantation dose may be between $1E13/cm^2$ and $1E16/cm^2$, with a more typical range being $1E14/cm^2$ to $1E15/cm^2$. The energy of the implant may be between 0.5 keV and 200 keV, with a more typical range being 2 keV to 30 keV.

As FIG. 3 illustrates, the tilted implantation 77 defined boundary between the portions 51, 52 of the as deposited hardmask 50, is self aligned to the gate-stack 10. This self alignment feature allows for a precision in the masking which may not be attainable by lithographic means, since, as discussed earlier, the gate-length 15 is often smaller than the minimum lithographic mask alignment tolerance. Hence, the method of combining a hardmask and tilted angle implantation may be extendable to whatever small dimensions the device fabrication arts are progressing to. The gate-length of devices contemplated in embodiments of the present invention may be between 5 nm and 100 nm, with a more typical range being 10 nm to 40 nm.

Figure 4:
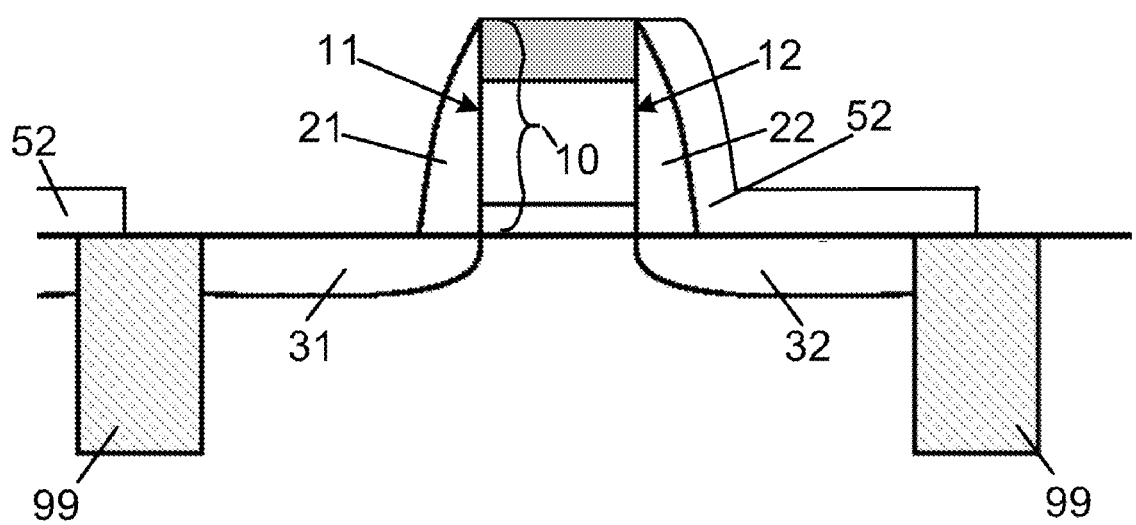
FIG. 4 shows a state of the device fabrication where the implanted portion of the hardmask has been removed.

FIG. 4 shows a state of the device fabrication where the first portion of the hardmask has been removed, and only the second portion 52 remains in place. The second portion 52 of the hardmask is in a position where it protects the second junction 32. Consequently, processing steps may take place to modify the first junction 31 without disturbing the second junction 32. Removal of the first portion 51 of the hardmask may follow etching steps known to those skilled in the art, for example, by an aqueous etch solution containing hydrofluoric (HF) acid. Having protected the second junction 32, which may be either the source or the drain, one may proceed with the replacement of the first junction.

Figure 5A:
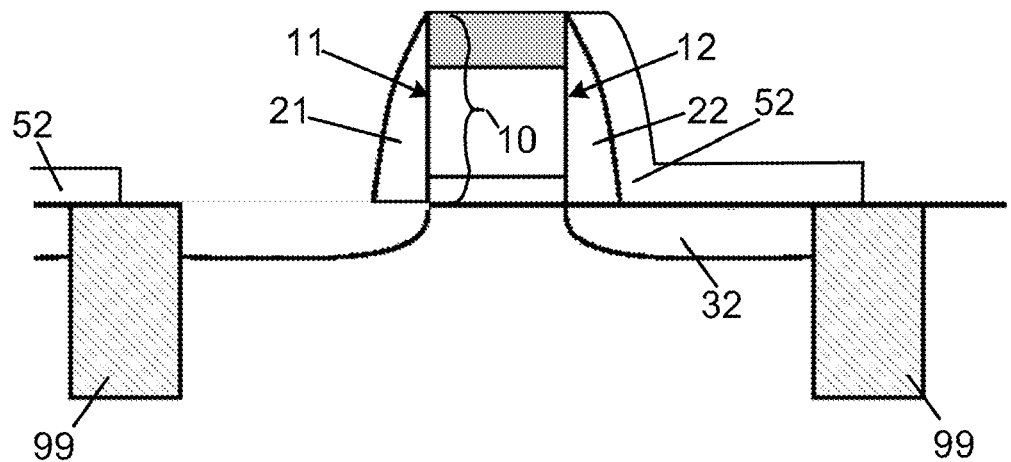
FIGS. 5A and 5B show a state of the device fabrication after removals of the junction and of a spacer portion.
Figure 5B:
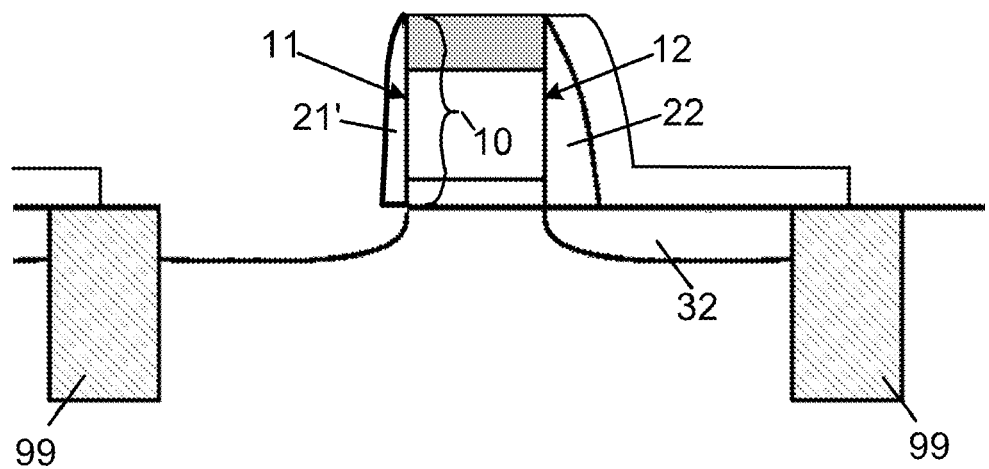

FIGS. 5A and 5B show a state of the device fabrication after removals of the junction and of a spacer portion. As detailed earlier, a TFET uses junctions of differing type, consequently the first junction, which was of same conductivity type as the second junction, has be removed, typically by etching. Such etching may proceed in various manners that are known to those skilled in the art. One may use either dry etching, or wet etching. One may use timing for stopping the etch. One may also take advantage of the fact that the first junction was highly doped, and use an etch which is selective in regard to dopant concentration, such as, for instance, ammonia. FIG. 5A illustrates the state of fabrication once the first junction 31 has been fully removed. FIG. 5B shows the possibility of removing, at least partially, the spacer 21 covering the first side 11 of the gate-stack. In FIG. 5B and in the following figures the remaining spacer is indicated as 21', displaying that it as a left over portion of the original spacer 21. Leaving in place only a portion of the spacer 21' may have device property advantages that will be discussed later. The surface left exposed after removal of the first junction may be exposed to further cleaning procedures in preparation for a selective epitaxy.

Figure 6:
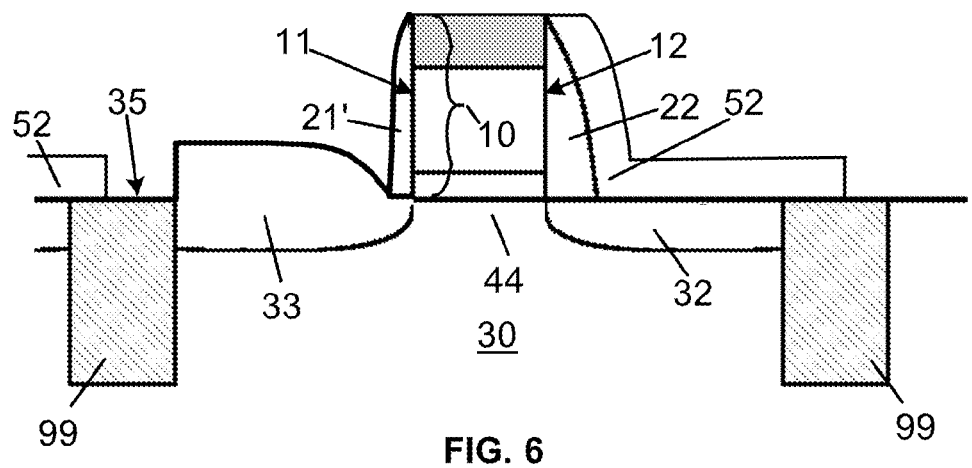
FIG. 6 shows a state of the device fabrication with a new epitaxially regrown junction.

FIG. 6 shows a state of the device fabrication with a new epitaxially regrown junction. In the place of the first junction 31, a new junction 33 has been regrown by selective epitaxy. During the epitaxial growth the junction 33 is also being doped, as it is commonly referred to: it being doped in situ. The doping of the new junction 33 is of a second type, which is differing from the first type of doping of the second junction 32. If the second junction 32 is p-type, then the new junction 33 is doped n-type, and conversely if second junction 32 is n-type, then the new junction 33 is doped p-type. In a typical embodiment of the invention the second junction 32 is arsenic As, and or phosphorus (P), doped n-type, and the new junction 33 during epitaxy is in situ boron (B) doped to p-type.

The terms "epitaxy", "epi", "epitaxial growth" "epitaxial relation", "epitaxially", etc. carry their customary usage: meaning that a layer is formed on a crystalline surface, which layer has the same symmetry and crystalline orientation as the crystalline surface itself. Typically, a single crystal lattice structure carries across an interface. Customarily in epitaxy a single crystal, or monocrystalline, material forms a platform onto which another single crystal material with matching crystalline characteristics is deposited by one of several techniques known in the art. Such techniques include without limitation, for instance, molecular beam epitaxy (MBE), and various types of chemical vapor depositions (CVD). The term selective means the during the epitaxial deposition there may not be need for masking because growth occur only the exposed seeding surfaces.

As depicted in FIG. 6, the new junction 33 is characterized as being a raised junction. Raised means that the junction material protrudes above the principal surface 35 of the device. Raising a junction is advantageous because it reduces the junction resistance, and it is easier to form contacts with it. Leaving only a partial spacer 21' in place is helpful from decreased junction resistance point of view. The thick, lower resistance, part of the new junction 33 is able to be nearer to the channel region 44 when the spacer 21' is thinner.

One may select various material combinations for the junctions and the channel region, in a manner that may balance device performance with simplicity of processing. One may select the second junction 32, the channel region 44, and the new junction 33 all to be essentially of Si. One may also select for an embodiment the second junction 32, the channel region 44, and the new junction 33 all to be SiGe. One may also select the second junction 32, and the channel region 44, to be essentially of Si, and select the new junction 33 all to be SiGe. In general for TFETs, higher Ge concentration means increased device current in the turn on state of the device. The Ge content in the SiGe may range from 10% to 60% atomic concentration.

Figure 7:
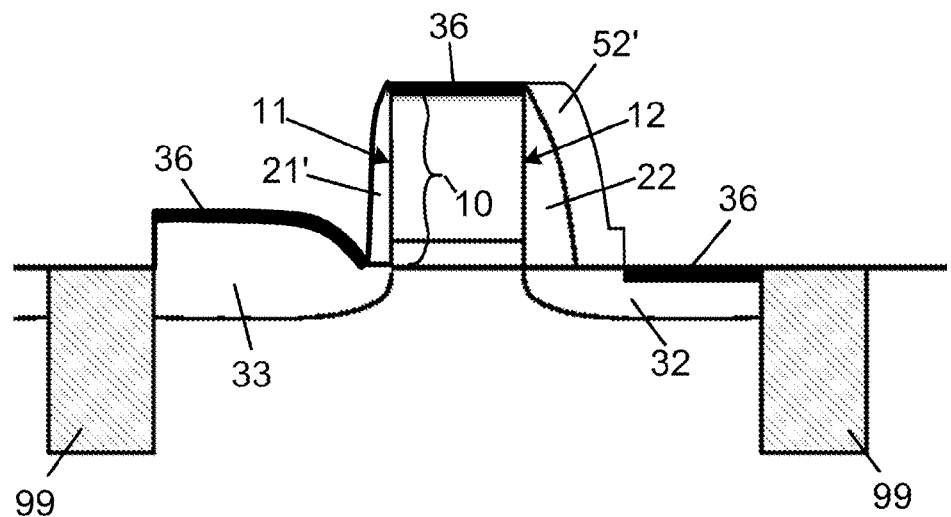
FIG. 7 shows an essentially completed asymmetric tunnel FET in an embodiment of the invention.

FIG. 7 shows an essentially completed asymmetric tunnel FET in an embodiment of the invention. After reaching the state as shown in FIG. 6, the TFET may be brought to completions with processes known in the art, and used in CMOS processing. The structure illustrated in FIG. 7 may be obtained from the one shown in FIG. 6. The second portion of the hard mask 52 in some embodiments may be fully removed. In alternate embodiments part of the second portion 52 may be left in place 52'. This remainder of the hardmask 52' and the originally fabricated spacer 22 may be regarded as a single spacer formation, which has its counterpart on the first side 11 of the gate-stack 10, in the spacer formation 21' which is a remainder of the original spacer of the first side 11. The two spacer formations on the opposing sides of the gate-stack, together with the raised junction gives rise to an asymmetrical TFET device. The advantage of leaving part of the hardmask 52' in place is that it may offer better prevention against shorting the junction 32 to the gate-stack 10 during metallization 36 of the junctions 32, 33 and the gate-stack 10. The specifics of the metallization may depend on the detailed material composition of the gate-stack 10. In an embodiment of the disclosure the original protective material 7, which may be nitride, is removed and the metallization 36 proceed as a standard, known in the art, self aligned silicidation (salicide). Following the stage of the device structure illustrated in FIG. 7, the structure is ready to be contacted and wired into an integrated circuit.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

The foregoing specification also describes processing steps. It is understood that the sequence of such steps may vary in different embodiments from the order that they were detailed in the foregoing specification. Consequently, the ordering of processing steps in the claims, unless specifically stated, for instance, by adjectives as "before", "preceding", "ahead of", "after", and similar ones, does not imply or necessitate a fixed order of step sequence.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "underneath", "top", "side", "over", "parallel", "adjacent", "perpendicular", "tilted", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many modifications and variations of the present invention are possible in light of the above teachings, and could be apparent for those skilled in the art. The scope of the invention is defined by the appended claims.

The invention claimed is:

1. A method for fabricating an FET device, said method comprising:
    forming a hard-mask, which hard-mask covers a gate-stack, a first junction and a second junction, wherein said gate-stack has a first side and a second side and said first junction and said second junction respectively adjoin said gate-stack, wherein said first junction and said second junction both are of a first conductivity type;
    performing an ion implantation at a tilted angle, wherein a first portion of said hard-mask is receiving said ion implantation and a second portion of said hard-mask is not receiving said ion implantation due to being shadowed by said gate-stack;
    selecting said tilted angle in such manner that said first portion covers said first side and adjoining said first junction, while said second portion covers said second side and adjoining said second junction;
    performing a selective etch, wherein said first portion of said hard mask is removed and said second portion of said hard-mask remains in place;
    removing said first junction by etching, while said second junction is being protected by said second portion of said hard-mask;
    depositing by selective epitaxy a new junction adjoining said first side, and in-situ doping said new junction to a second conductivity type; and
    wherein said FET device comprises said gate-stack, said new junction, said second junction, and a channel region underneath said gate-stack, wherein said channel region, said new junction, and said second junction are of SiGe, and wherein said FET device is characterized as being a tunnel FET (TFET) device.

2. The method of claim 1, wherein said method further comprises:
    selecting first conductivity type to be n-type, whereby said second conductivity type is p-type.

3. The method of claim 1, wherein said method further comprises:
    selecting first conductivity type to be p-type, whereby said second conductivity type is n-type.

4. The method of claim 1, wherein said method further comprises:
    fabricating spacers over said first side and said second side of said gate-stack;
    partially removing said spacer over said first side, while said spacer over said second side is being protected by said second portion of said hard-mask; and
    wherein said FET comprises said partially removed spacer over said first side and said spacer covered by said hard-mask over said second side.

5. The method of claim 1, wherein said gate-stack has a gate-length, and said fabricating method has a minimum mask alignment tolerance, said method further comprises:

selecting said gate-length to be less than said minimum mask alignment tolerance.

6. The method of claim 1, wherein said gate-stack has a gate-length, said method further comprises:

selecting said gate-length to be between 40 nm and 10 nm.

7. The method of claim 6, wherein said FET device is further characterized as being a metal gate device.

8. The method of claim 1, wherein said FET device is further characterized as being a polysilicon gate device.

* * * * *